United States Patent
Chong et al.

(10) Patent No.: US 6,825,967 B1
(45) Date of Patent: Nov. 30, 2004

(54) SHAPED ELECTRODES FOR MICRO-ELECTRO-MECHANICAL-SYSTEM (MEMS) DEVICES TO IMPROVE ACTUATOR PERFORMANCE AND METHODS FOR FABRICATING THE SAME

(75) Inventors: John Chong, Santa Barbara, CA (US); Seung Bok Lee, Ithaca, NY (US); Noel MacDonald, Santa Barbara, CA (US); Robert Lewis, Santa Barbara, CA (US); Peter Hunt, Scotts Valley, CA (US)

(73) Assignee: Calient Networks, Inc., San Jose, CA (US)

( * ) Notice: Subject to any disclaimer, the term of this patent is extended or adjusted under 35 U.S.C. 154(b) by 238 days.

(21) Appl. No.: 09/676,459

(22) Filed: Sep. 29, 2000

(51) Int. Cl.[7] ............................................. G02B 26/00
(52) U.S. Cl. ..................... 359/290; 359/293; 359/295; 359/900
(58) Field of Search ................. 359/290, 291, 359/295, 298, 293, 294, 900

(56) References Cited

U.S. PATENT DOCUMENTS

| | | |
|---|---|---|
| 3,493,820 A | 2/1970 | Rosvold |
| 4,104,086 A | 8/1978 | Bondur et al. |
| 4,365,863 A | 12/1982 | Broussaud |
| 4,421,381 A | 12/1983 | Ueda et al. .................... 350/6.6 |
| 4,519,128 A | 5/1985 | Chesebro et al. |
| 4,553,436 A | 11/1985 | Hansson |
| 4,571,819 A | 2/1986 | Rogers et al. |
| 4,598,585 A | 7/1986 | Boxenhorn ............... 73/504.12 |
| 4,613,203 A | 9/1986 | Proetel et al. |
| 4,626,066 A | 12/1986 | Levinson |
| 4,631,641 A | 12/1986 | Brombal et al. |
| 4,654,663 A | 3/1987 | Alsenz et al. ............. 340/870.3 |
| 4,670,092 A | 6/1987 | Motamedi |
| 4,688,069 A | 8/1987 | Joy et al. |

(List continued on next page.)

FOREIGN PATENT DOCUMENTS

| | | |
|---|---|---|
| DE | 4224601 A1 | 1/1994 |
| DE | 19757181 A1 | 7/1999 |

(List continued on next page.)

OTHER PUBLICATIONS

Mihailovich, Zhang, Shaw, MacDonald, "Single–Crystal Silicon Torsional Resonators", 0–7803–0957–2/93, 1993 IEEE, p.184–188.

Timothy J. Broshnihan, James M. Bustillo, Albert P. Pisano & Roger T. Howe, "Embedded Interconnect & Electrical Isolation for High–Aspect–Ratio, SOI Inertial Instruments," Berkeley Sensor & Actuator Sensor, pp. 637–640, Transducers '97, 1997 International Conference on Solid–State Sensors and Actuators (Chicago, Jun. 16–19, 1997).

(List continued on next page.)

*Primary Examiner*—Georgia Epps
*Assistant Examiner*—Tuyen Tra
(74) *Attorney, Agent, or Firm*—Blakely, Sokoloff, Taylor & Zafman LLP

(57) ABSTRACT

Shaped electrodes for micro-electro-mechanical-system (MEMS) devices to improve actuator performance and methods for fabricating the same are disclosed. The shaped electrodes utilize its three-dimensional geometry to shape an electric field for electrostatic actuation for MEMS devices. For example, the height, width, length, sidewall slope, and layout of the shaped electrodes can be used to provide an optimum electric field in moving a MEMS mirror device. The shaped electrodes can provide electrostatic actuation at a low operating voltage and provide an optimum electric field for maximum tilt or angular range of motion for a MEMS mirror device. The shaped electrodes can be fabricated simply by using a pillar wafer and an electrode wafer. The pillar wafer can be used to form pillars as electrodes, or, alternatively, as barriers. A single substrate can also be used to form pillars and electrodes.

7 Claims, 11 Drawing Sheets

U.S. PATENT DOCUMENTS

| | | |
|---|---|---|
| 4,696,062 A | 9/1987 | LaBudde |
| 4,706,374 A | 11/1987 | Murakami |
| 4,738,500 A | 4/1988 | Grupp et al. |
| 4,784,720 A | 11/1988 | Douglas |
| 4,823,402 A | 4/1989 | Brooks |
| 4,834,484 A | 5/1989 | Gorman et al. |
| 4,834,485 A | 5/1989 | Lee |
| 4,838,631 A | 6/1989 | Chande et al. |
| 4,838,637 A | 6/1989 | Torok et al. |
| 4,851,080 A | 7/1989 | Howe et al. |
| 4,855,017 A | 8/1989 | Douglas |
| 4,859,012 A | 8/1989 | Cohn |
| 4,866,699 A | 9/1989 | Brackett et al. |
| 4,876,217 A | 10/1989 | Zdebel |
| 4,922,756 A | 5/1990 | Henrion ............... 73/517 R |
| 4,923,269 A | 5/1990 | Healey |
| 4,932,745 A | 6/1990 | Blonder |
| 4,952,010 A | 8/1990 | Healey et al. |
| 5,016,072 A | 5/1991 | Greiff ............... 357/26 |
| 5,068,203 A | 11/1991 | Logsdon et al. |
| 5,083,857 A | 1/1992 | Hornbeck ............... 359/291 |
| 5,095,752 A | 3/1992 | Suzuki et al. |
| 5,097,354 A | 3/1992 | Goto ............... 359/212 |
| 5,121,180 A | 6/1992 | Beringhause et al. |
| 5,126,812 A | 6/1992 | Greiff |
| 5,172,262 A | 12/1992 | Hornbeck ............... 359/223 |
| 5,198,390 A | 3/1993 | MacDonald et al. |
| 5,199,088 A | 3/1993 | Magel |
| 5,203,208 A | 4/1993 | Bernstein ............... 73/505 |
| 5,208,880 A | 5/1993 | Riza et al. |
| 5,221,987 A | 6/1993 | Laughlin |
| 5,226,321 A | 7/1993 | Varnham et al. ............... 73/505 |
| 5,235,187 A | 8/1993 | Arney et al. |
| 5,255,332 A | 10/1993 | Welch et al. |
| 5,271,075 A | 12/1993 | Gfeller et al. |
| 5,287,082 A | 2/1994 | Arney et al. |
| 5,291,324 A | 3/1994 | Hinterlong |
| 5,316,979 A | 5/1994 | MacDonald et al. |
| 5,345,824 A | 9/1994 | Sherman et al. |
| 5,393,375 A | 2/1995 | MacDonald et al. |
| 5,397,904 A | 3/1995 | Arney et al. |
| 5,399,415 A | 3/1995 | Chen et al. |
| 5,420,946 A | 5/1995 | Tsai |
| 5,426,070 A | 6/1995 | Shaw et al. |
| 5,427,975 A | 6/1995 | Sparks et al. |
| 5,428,259 A | 6/1995 | Suzuki |
| 5,436,986 A | 7/1995 | Tsai |
| 5,440,654 A | 8/1995 | Lambert, Jr. |
| 5,444,566 A | 8/1995 | Gale et al. |
| 5,449,903 A | 9/1995 | Arney et al. |
| 5,454,906 A | 10/1995 | Baker et al. |
| 5,471,332 A | 11/1995 | Shiragaki et al. |
| 5,483,158 A | 1/1996 | van Heteren et al. |
| 5,488,862 A | 2/1996 | Neukermans et al. .... 73/504.02 |
| 5,501,893 A | 3/1996 | Laermer et al. |
| 5,506,175 A | 4/1996 | Zhang et al. |
| 5,524,153 A | 6/1996 | Laor ............... 385/16 |
| 5,536,988 A | 7/1996 | Zhang et al. ............... 310/309 |
| 5,555,558 A | 9/1996 | Laughlin |
| 5,563,343 A | 10/1996 | Shaw et al. |
| 5,568,575 A | 10/1996 | Sato |
| 5,581,643 A | 12/1996 | Wu |
| 5,600,383 A | 2/1997 | Hornbeck |
| 5,610,335 A | 3/1997 | Shaw et al. |
| 5,611,888 A | 3/1997 | Bosch et al. |
| 5,611,940 A | 3/1997 | Zettler |
| 5,627,669 A | 5/1997 | Orino et al. |
| 5,628,917 A | 5/1997 | MacDonald et al. |
| 5,629,790 A | 5/1997 | Neukermans et al. ....... 359/198 |
| 5,637,189 A | 6/1997 | Peeters et al. |
| 5,642,015 A | 6/1997 | Whitehead et al. |
| 5,645,684 A | 7/1997 | Keller |
| 5,646,067 A | 7/1997 | Gaul |
| 5,647,033 A | 7/1997 | Laughlin |
| 5,648,618 A | 7/1997 | Neukermans et al. |
| 5,670,881 A | 9/1997 | Arakawa et al. |
| 5,673,139 A | 9/1997 | Johnson ............... 359/291 |
| 5,682,062 A | 10/1997 | Gaul |
| 5,703,728 A | 12/1997 | Smith et al. |
| 5,719,073 A | 2/1998 | Shaw et al. |
| 5,726,073 A | 3/1998 | Zhang et al. |
| 5,759,913 A | 6/1998 | Fulford, Jr. et al. |
| 5,770,465 A | 6/1998 | MacDonald et al. |
| 5,784,187 A | 7/1998 | Cunningham et al. |
| 5,798,557 A | 8/1998 | Salatino et al. |
| 5,804,084 A | 9/1998 | Nasby et al. |
| 5,841,917 A | 11/1998 | Jungerman et al. |
| 5,846,849 A | 12/1998 | Shaw et al. |
| 5,847,454 A | 12/1998 | Shaw et al. |
| 5,857,048 A | 1/1999 | Feuer et al. |
| 5,869,916 A | 2/1999 | Suzuki et al. |
| 5,872,880 A | 2/1999 | Maynard |
| 5,878,177 A | 3/1999 | Karasan et al. |
| 5,912,094 A | 6/1999 | Aksyuk et al. |
| 5,912,608 A | 6/1999 | Asada |
| 5,915,168 A | 6/1999 | Salatino et al. |
| 5,920,417 A | 7/1999 | Johnson ............... 359/223 |
| 5,923,798 A | 7/1999 | Aksyuk et al. |
| 5,933,746 A | 8/1999 | Begley et al. |
| 5,943,157 A | 8/1999 | Florence et al. |
| 5,943,454 A | 8/1999 | Aksyuk et al. |
| 5,960,132 A | 9/1999 | Lin |
| 5,960,133 A | 9/1999 | Tomlinson |
| 5,961,767 A | 10/1999 | Aksyuk et al. |
| 5,963,682 A | 10/1999 | Dorschner et al. |
| 5,969,848 A | 10/1999 | Lee et al. |
| 5,995,688 A | 11/1999 | Aksyuk et al. |
| 5,998,816 A | 12/1999 | Nakaki et al. |
| 5,998,906 A | 12/1999 | Jerman et al. |
| 5,999,303 A | 12/1999 | Drake |
| 6,000,280 A | 12/1999 | Miller et al. ............... 73/105 |
| 6,002,818 A | 12/1999 | Fatehi et al. |
| 6,020,272 A | 2/2000 | Fleming |
| 6,028,690 A | 2/2000 | Carter et al. |
| 6,044,705 A | 4/2000 | Neukermans et al. |
| 6,061,166 A | 5/2000 | Furlani et al. |
| 6,072,617 A | 6/2000 | Henck |
| 6,075,239 A | 6/2000 | Aksyuk et al. |
| 6,075,639 A | 6/2000 | Kino et al. |
| 6,078,016 A | 6/2000 | Yoshikawa et al. |
| 6,097,858 A | 8/2000 | Laor ............... 385/16 |
| 6,097,859 A | 8/2000 | Solgaard et al. |
| 6,097,860 A | 8/2000 | Laor ............... 385/17 |
| 6,101,299 A | 8/2000 | Laor ............... 385/16 |
| 6,121,552 A | 9/2000 | Brosnihan et al. |
| 6,128,121 A | 10/2000 | Choi et al. |
| 6,178,284 B1 | 1/2001 | Bergmann et al. |
| 6,191,518 B1 | 2/2001 | Suzuki |
| 6,201,631 B1 * | 3/2001 | Greywall ............... 359/245 |
| 6,220,561 B1 | 4/2001 | Garcia |
| 6,229,640 B1 | 5/2001 | Zhang |
| 6,233,087 B1 * | 5/2001 | Hawkins et al. ............ 359/290 |
| 6,239,473 B1 | 5/2001 | Adams et al. |
| 6,245,590 B1 | 6/2001 | Wine et al. |
| 6,253,001 B1 | 6/2001 | Hoen |
| 6,256,430 B1 | 7/2001 | Jin et al. |
| 6,262,827 B1 | 7/2001 | Ueda et al. |
| 6,278,812 B1 | 8/2001 | Lin et al. |
| 6,289,145 B1 | 9/2001 | Solgaard et al. |
| 6,295,154 B1 | 9/2001 | Laor et al. |
| 6,300,665 B1 | 10/2001 | Peeters et al. |

| | | | |
|---|---|---|---|
| 6,317,530 B1 | 11/2001 | Ford | |
| 6,320,993 B1 | 11/2001 | Laor | |
| 6,320,998 B1 | 11/2001 | Okayama et al. | |
| 6,327,398 B1 | 12/2001 | Solgaard et al. | |
| 6,329,738 B1 | 12/2001 | Hung et al. | |
| 6,330,102 B1 | 12/2001 | Daneman et al. | |
| 6,333,584 B1 | 12/2001 | Jerman et al. | |
| 6,337,760 B1 | 1/2002 | Huibers et al. | |
| 6,347,167 B1 | 2/2002 | Hagelin | |
| 6,396,975 B1 | 5/2002 | Wood et al. | |
| 6,552,840 B2 * | 4/2003 | Knipe | 359/291 |
| 2001/0025530 A1 | 10/2001 | Sakai et al. | |
| 2001/0044165 A1 | 11/2001 | Lee et al. | |
| 2002/0071171 A1 * | 6/2002 | Greywall | 359/292 |
| 2002/0093721 A1 * | 7/2002 | Knipe | 359/291 |

FOREIGN PATENT DOCUMENTS

| | | |
|---|---|---|
| DE | 19800745 A1 | 7/1999 |
| EP | 0 834759 A2 | 4/1998 |
| EP | 0 980014 A1 | 2/2000 |
| EP | 1 120989 A1 | 8/2001 |
| GB | 2175705 A | 12/1986 |
| GB | 2 239 101 A | 6/1991 |
| GB | 2 275 787 A | 9/1994 |
| JP | 60-107017 | 6/1985 |
| JP | 5-107485 A | 4/1993 |
| JP | Hei 6-180428 | 6/1994 |
| WO | WO 94/18697 | 8/1994 |
| WO | WO 97/04283 | 2/1997 |
| WO | WO 99/36941 | 7/1999 |
| WO | WO 99/36948 | 7/1999 |
| WO | WO 99/66354 | 12/1999 |
| WO | WO 99/67666 | 12/1999 |
| WO | WO 00/20899 | 4/2000 |
| WO | WO 01/33898 A2 | 5/2001 |
| WO | WO 01/39413 A2 | 5/2001 |

OTHER PUBLICATIONS

Janusz Bryzek, Kurt Petersen, & Wendell McCulley, "Micromachines on the March," IEEE Spectrum, pp. 20–31 (May 1994).

Wolfgang Kuehnel and Steven Sherman, "A Surface Micromachined Silicon Acclerometer with On–Chip Detection Circuitry," Sensors and Actuators A 45, pp. 7–16 (1994).

Howard K. Rockstad, et al., "A Miniature High–Sensitivity Broadband Accelerometer Based on Electron Tunneling Transducers," Sensors and Actuators A 43, pp. 107–114 (1994).

Lynn Michelle Roylance and James B. Angell, "A Batch–Fabricated Silicon Accelerometer," IEEE Transactions on Electron Devices, vol. Ed–26, No. 12, pp. 1911–1917 (Dec. 1979).

Kevin A. Shaw, et al., "SCREAM I: A Single Mask, Single–Crystal Silicon, Reactive Ion Etching Process for Microelectromechanical Structures," Sensors and Actuators A, 40 pp. 63–70 (1994).

Toshiki Hirano, et al., "Design, Fabrication, and Operation of Submicron Gap Comb–Drive Microactuators," J. of Microelectromechanical Systems, vol. 1, No. 1, pp. 52–59, (Mar. 1992).

V.P. Jaecklin. et al., "Comb Actuators for XY–Microstages," Sensors and Actuators, A, 39, pp. 83–89 (1993).

Susanne C. Arney and Noel C. MacDonald, et al., "Formation of Submicron Silicon–On–Insulator Sructures by Lateral Oxidation of Substrate–Slicon Islands," J. Vac. Sci. Technol. B vol. 6 No. 1, pp. 341–345, (Jan./Feb. 1988).

Diederick W. de Bruin, et al., "Second–Order Effects in Self–Testable Accelerometers," IC Sensors, IEEE, pp. 149–152 (1990).

"Lucent's New All–Optical Router Uses Bell Labs Microscopic Mirrors," Bells Labs press release, pp. 1–4, Nov. 10, 1999. http://www.bell–labs.com/news/1999/november/10/1.html.

Rudolf F. Graf, Radio Shack Dictionary of Electronics, p. 639, Definition of Varibale Capacitor with Picture (1974).

M. Adrian Michalicek, Wenge Zhang, Kevin F. Harsh, Victor M. Bright, and Y.C. Lee, "Micromirror Arrays Fabricated by Flip–Chip Assembly," Part of the SPIE Conference on Miniaturizes Systems with Micro–Optics and MEMs, Santa Clara, SPIE vol. 3878, pp. 68–79 (Sep. 1999).

Chris Seung–Bok Lee, Sejin Han, Noel C. MacDonald, "Multiple Depth, Single Crystal Silicon MicroActuators for Large Displacement Fabricated by Deep Reactive Ion Etching," Solid–State Sensor and Actuator Workshop, Hilton Head Island, SC, pp. 45–50 (Jun. 8–11, 1998).

Russell Y. Webb, Scott G. Adams, and Noel C. MacDonald, "Suspended Thermal Oxide Trench Isolation for SCS MEMS." SPIE vol. 3519, Boston, MA, pp. 196–199 (Nov. 1998).

Seung Chris B. Lee, "Two–Depth, Single Crystal Silicon Microelectromechanical Systems," A Dissertation Presented to the Faculty of the Graduate School of Cornell University in Partial Fulfillment of the Requirements for the Degree of Doctor of Philosophy, (Jan. 2000).

Leslie A. Field, Diane L. Burriesci, Peter R. Robrish, and Richard C. Ruby, "Micromachined 1×2 Optical–Fiber Switch," Sensors and Actuators A, 53, pp. 311–315, (1996).

Larry J. Hornbeck, "Digital Light Proecssing for High–Brightness, High–Resolution Applications," SPIE vol. 3013, San Jose, CA, pp. 27–40 (Feb. 1997).

Noel C. MacDonald, "SCREAM MicroElectroMechanical Systems." Microelectronic Engineering, 32, pp. 49–73 (1996).

Ming C. Wu, "MEMS for Optical and RF Applications." UCLA Extension, Department of Engineering, Information Systems and Technical Management, Engineering: 823.52, Nov. 1–3, 1999.

Wolfgang Hofmann, Chris S. Lee, and Noel C. MacDonald, Monolithic Three–Dimensional Single–Crystal Silicon Microelectromechanical Systems, Sensors and Materials, vol. 10, No. 6, pp. 337–350 (1998).

William C. Tang, Martin G. Lim, and Roger T. Howe, "Electrostatic Comb Drive Levitation and Control Method" Journal of Microelectromechanical Systems, vol. 1, No. 4, pp. 170–178 (Dec. 1992).

M.C. Wu, L.–Y Lin, S.–S. Lee, and K.S.J. Pister, "Micromachined Free–Space Integrated Micro–Optics," Sensors and Actuators A. 50, pp. 127–134 (1995).

Joseph E. Ford, Vladimir A. Aksyuk, David J. Bishop, and James A. Walker, "Wavelength Add–Drop Switching Using Tilting Micromirrors," Journal of Lightwave Technology, vol. 17, No. 5, pp. 904–911 (May 1999).

Cornel Marxer and Nicolaas F. de Rooij, "Micro–Opto–Mechanical 2×2 Switch for Single–Mode Fibers Based on Plasma–Etched Silicon Mirror and Electrostatic Actuation," Journal of Lightwave Technology, vol 17, No. 1, pp. 2–6 (Jan. 1999).

D.T. Neilson, V.A. Aksyuk, S. Arney, N.R. Basavanhally, K.S. Bhalla, D.J. Bishop, B.A. Boie, C.A. Bolle, J.V. Gates, A.M. Gottlieb, J.P. Hickey, N.A. Jackman, P.R. Kolodner, S.K. Korotky, B. Mikkelsen, F. Pardo, G. Raybon, R. Ruel, R.E. Scotti, T.W. Van Blarcum,,L. Zhang, and C.R. Giles, "Fully Provisional 112×112 Micro–Mechanical Optical Crossconnect With 35.8Tb/s Demonstrated Capacity," OFC 2000 Tech. Dig., Baltimore, Maryland, pp. 202–204 (Mar. 7–10, 2000).

Robert E. Mihailovich, Z. L. Zhang, K. A. Shaw, and Noel C. MacDonald, "Single–Crystal Silicon Torsional Resonators." School of Electrical Engineering, Cornell University, Ithaca, NY 14853, pp. 184–188, IEEE (Feb. 1993).

M.T.A. Salf and N. C. MacDonald, "Planarity of Large MEMS," Journal of Microelectromechanical Systems, 5, 79–97 (1996).

W.–H. Juan and S.W. Pang, "High–aspect–ratio Si Vertical Micromirror Arrays for Optical Switching," Journal of MicroElectroMechanical Systems, 7, 207,–213 (1998).

U. Gosele, et al., "Wafer Bonding for Microsystems Technologies," Sensors and Actuators A, vol. 74, pp. 161–168 (1999).

Rob Legtenberg, et al., "Comb–drive actuators for large displacements," Journal of Micromechaniss and Microengineering, vol. 6, No. 2, pp. 320–329, Jun. 1996.

Ronald E. Scotti et al., "The Challenges of Packaging MEMS Components for the All Optical Network of the Future," Design, Test, Integration, and Packaging of MEMS/MOEMS 2001, vol. 4408, pp. 19–27 (Apr. 25–27, 2001).

Chris S.B. Lee, Sejin Han, and Noel C. MacDonald, "Single Crystal Silicon (SCS) XY–Stage Fabricated by DRIE and IR alignment," MEMS 2000: The Thirteenth Annual International Conference on Micro Electro Mechanical Systems, pp. 28–33 (Jan. 23–27, 2000).

Chris S.B. Lee, Russell Y. Webb, John M. Chong, and Noel C. MacDonald, "Single Crystal Silicon (SCS) MicroMirror Arrays using Deep Silicon Etching and IR Alignment," MEMS 2000: The Thirteenth Annual International Conference on Micro Electro Mechanical Systems, pp. 441–448 (Jan. 23–27, 2000).

Lih Y. Lin and Evan L. Goldstein, "Micro–Electro–Mechanical Systems (MEMs) for WDM Optical–Crossconnect Networks," IEEE, pp. 954–957 (1999).

* cited by examiner

TRENCHES 772

INSULATOR 702

INSULATOR 702
METAL ROUTING LINE 706

PILLARS 750

SUBSTRATE 701
INSULATOR 702
METAL ROUTING LINE 706

US 6,825,967 B1

SHAPED ELECTRODES FOR MICRO-ELECTRO-MECHANICAL-SYSTEM (MEMS) DEVICES TO IMPROVE ACTUATOR PERFORMANCE AND METHODS FOR FABRICATING THE SAME

FIELD OF THE INVENTION

The present invention relates generally to micro-electro-mechanical-system (MEMS) devices. More particularly, the present invention relates to actuators for MEMS mirror devices. Specifically, the present invention relates to shaped electrodes for MEMS devices to improve actuator performance and methods for fabricating the same.

BACKGROUND OF THE INVENTION

A MEMS device is a micro-sized mechanical structure having electrical circuitry fabricated using conventional integrated circuit (IC) fabrication methods. One type of MEMS device is a microscopic gimbaled mirror device. A gimbaled mirror device includes a mirror component, which is suspended off a substrate, and is able to pivot about a gimbal due to electrostatic actuation. Electrostatic actuation creates an electric field that causes the mirror component to pivot. By allowing the mirror component to pivot, the mirror component is capable of having an angular range of motion in which the mirror component can redirect light beams to varying positions.

One type of electrostatic actuator for a gimbaled mirror device is parallel plate actuator. A parallel plate actuator uses planar electrodes formed on a planar surface of a substrate below a suspended mirror component. A voltage is applied to the planar electrodes that create an electric field to cause the mirror component to move.

A disadvantage with the parallel plate actuator for a gimbaled mirror is that the force required to move the mirror component is directly proportional to the square of the distance of the gap between the planar surface of the electrodes, which is substantially at the surface of the substrate, and the mirror component. As such, to obtain a large range of angular motion, the mirror component must be suspended at a large height above the electrodes. In such a configuration, a large amount of voltage is necessary to produce force for actuation.

A further disadvantage of using the parallel plate actuator is that it is difficult to shape the electric field. That is, the shape of the electric field for actuation is limited by the dimensions of only the top surface of the planar electrodes. Furthermore, the wiring necessary to connect the planar electrodes to a high voltage source for electrostatic actuation can cause interference (i.e., cross-talk) with neighboring mirror devices.

Another type of electrostatic actuator for a MEMS device is a comb-drive actuator. Prior combed finger actuators use a set of interdigitated fingers to move another set of interdigitated fingers. A disadvantage with prior comb-drive actuators is that it requires moving the "mass" of the moveable interdigitated fingers. Thus, to use a comb-drive actuator for a MEMS device, a large amount of power is required. Another disadvantage of using a comb-drive actuator is that it requires complex fabrication processes.

SUMMARY OF THE INVENTION

Shaped electrodes for MEMS devices to improve actuator performance and methods for fabricating the same are disclosed. A micro-electro-mechanical-system (MEMS) device is disclosed. The MEMS device includes one or more mirror devices and one or more shaped electrodes. Each shaped electrode is to provide an electric field for electrostatic actuation to move one of the mirror devices. Each shaped electrode is to shape the electric field based on a three dimensional geometry of the shaped electrode.

A method of fabricating a MEMS device is disclosed. A pillar wafer is attached to an electrode wafer. One or more pillars are formed from the pillar wafer. Furthermore, one or more gimbaled mirror devices can be formed on the electrode wafer such that the pillars are to provide an electric field or to provide a barrier for the mirror devices.

Another method of fabricating a MEMS device is disclosed. A first substrate having a metal contact is attached to a second substrate having an electrode. The metal contact is connected with the electrode. One or more pillars are formed from the first substrate. Furthermore, one or more gimbaled mirror devices can be formed on the second substrate such that the pillars are to provide an electric field or to provide a barrier for the mirror devices.

Another method of fabricating a MEMS device is disclosed. A plurality of trenches is formed in a first side of a substrate. An insulator is formed in the plurality of trenches and on the first side of the substrate such that the insulator defines exposed areas of the first side of the substrate. A metal line is formed on the insulator and exposed areas of the first side of the substrate. Portions of a second side of the substrate are removed selectively to form pillars connected with the insulator and the metal line. Furthermore, one or more gimbaled mirror devices can be formed on the substrate such that the pillars are to provide an electric field or to provide a barrier for the mirror devices.

Other features and advantages of the present invention will be apparent from the accompanying drawings, and from the detailed description, which follows below.

BRIEF DESCRIPTION OF THE DRAWINGS

The present invention is illustrated by way of example and not intended to be limited by the figures of the accompanying drawings in which like references indicate similar elements and in which.

DETAILED DESCRIPTION

Figure 1:
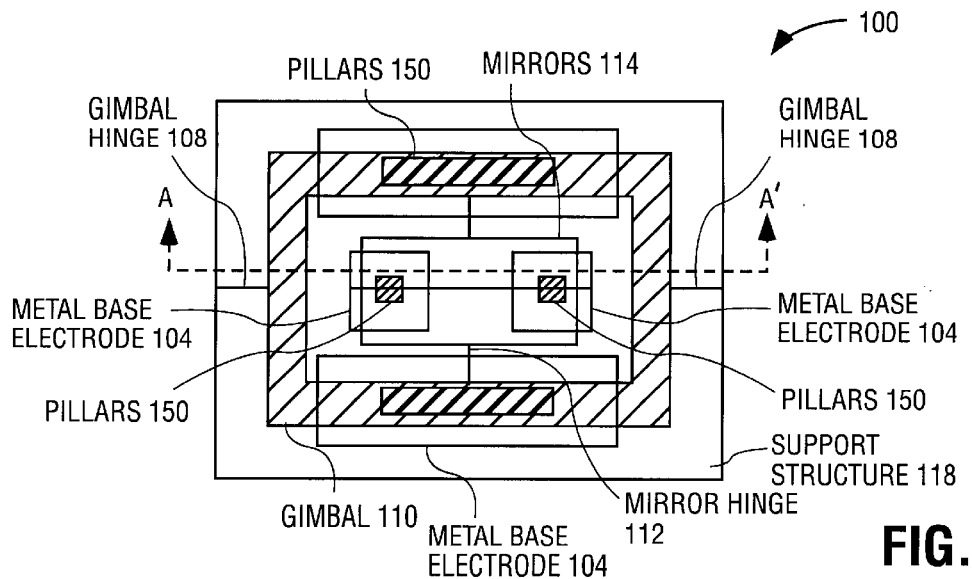
FIG. 1 illustrates a top view of a MEMS device according to one embodiment of the invention.

Shaped electrodes for MEMS devices to improve actuator performance and methods for fabricating the same are described.

As described in more detail below, an embodiment of the invention is a micro-electro-mechanical-system (MEMS) device, which includes one or more mirror devices and one or more shaped electrodes. Each shaped electrode is to provide an electric field for electrostatic actuation to move one of the mirror devices. Each shaped electrode is to shape the electric field based on a three-dimensional geometry of the shaped electrode ("three dimensional electrode").

The use of a three dimensional electrode has substantial advantages over traditional actuators (e.g., parallel plate actuators that use two dimensional planar electrodes). For example, an intended advantage is to decrease the voltage necessary for actuation.

Another intended advantage is to increase the range of motion for a moving part (e.g., a mirror device) by designing the three dimensional electrode such that it does not mechanically interfere with the moving part.

Another intended advantage is to increase the control over the range of motion of the moving part by designing the three dimensional electrode to shape electric fields such that unstable regions are not encountered as the moving part moves through its range of motion. For example, parameters such as height, width, length, sidewall slope, and layout of the electrodes can be utilized in designing the three dimensional electrode.

As described in more detail below, another embodiment of the invention is a method of fabricating a MEMS device in which a pillar wafer is attached to an electrode wafer. One or more pillars are formed form the pillar wafer. Furthermore, one or more gimbaled mirror devices can be formed on the electrode wafer such that the pillars are to provide an electric field or to provide a barrier for the mirror devices.

Another embodiment of the invention is a method of fabricating a MEMS device in which a first substrate having a metal contact is attached to a second substrate having an electrode. The metal contact is connected with the electrode. One or more pillars are formed from the first substrate. Furthermore, one or more gimbaled mirror devices can be formed on the second substrate such that the pillars are to provide an electric field or to provide a barrier for the mirror devices.

As described in more detail below, another embodiment of the invention is a method of fabricating a MEMS device in which a plurality of trenches are formed in a first side of a substrate. An insulator is formed in the plurality of trenches and on the first side of the substrate such that the insulator defines exposed areas of the first side of the substrate. A metal line is formed on the insulator and exposed areas of the first side of the substrate. Portions of a second side of the substrate are removed selectively to form pillars supported by the insulator and the metal line. Furthermore, one or more gimbaled mirror devices can be formed on the substrate such that the pillars are to provide an electric field or to provide a barrier for the mirror devices.

The methods for fabricating a MEMS device described herein provide substantial advantages in forming pillars, which can operate as electrodes or protective barriers. For example, an intended advantage of the present invention is to simplify the MEMS fabrication process by using a pillar wafer and an electrode wafer. That is, the pillar fabrication is separated from electrode fabrication.

Another intended advantage is to fabricate separately a moving part from the electrodes, which provides more flexibility and reliability in the MEMS fabrication process. Another intended advantage is to provide flexible design freedom in forming the pillars relative to electrodes with respect to the motion of the moving part (e.g., gimbaled mirror devices).

In the following description, the shaped electrodes or pillars are described to be implemented for MEMS mirror devices in a MEMS optical switch. Nevertheless, the shaped electrodes or pillars described herein can be implemented for other types of MEMS devices, which require moving microscopic structures. For example, the shaped electrodes or pillars can be implemented in scanning devices, raster devices, printing devices, and display devices.

In the following description, an "electrode wafer" refers to a wafer with metal lines formed thereon to be used in creating an electric field. In addition, a "pillar wafer" refers to a wafer, which is used to form "pillars." The pillars can be used as extended electrodes for actuation or as protective barriers.

Furthermore, in the following description, a layer can be selectively patterned on a semiconductor substrate using any combination of a deposition process, photolithography process, dry or wet etching process, liftoff process, or other semiconductor fabrication processes.

FIG. 1 is a top view of a MEMS device 100 according to one embodiment of the invention. Referring to FIG. 1, the MEMS device 100 includes a mirror 114 supported by a gimbal ("rotating frame") 110, which is supported by support structure 118 and gimbal hinge 108. Mirror 114 is connected with gimbal 110 by a mirror hinge 112. Pillars 150 are disposed below mirror 114. The pillars 150 are connected electrically with metal base electrodes 104. The pillars 150 can operate as electrodes to provide electrostatic actuation to move mirror 114. That is, mirror 114 can pivot selectively about mirror hinge 112 or gimbal hinge 108 from an electric field created from pillars 150. Alternatively, pillars 150 can be located adjacent to metal base electrodes 104 and act as barriers to block interference and cross talk between metal base electrodes 104. Although one mirror 114 is shown for MEMS device 100, an array of mirror devices can be implemented and formed on a substrate.

Figure 2A:
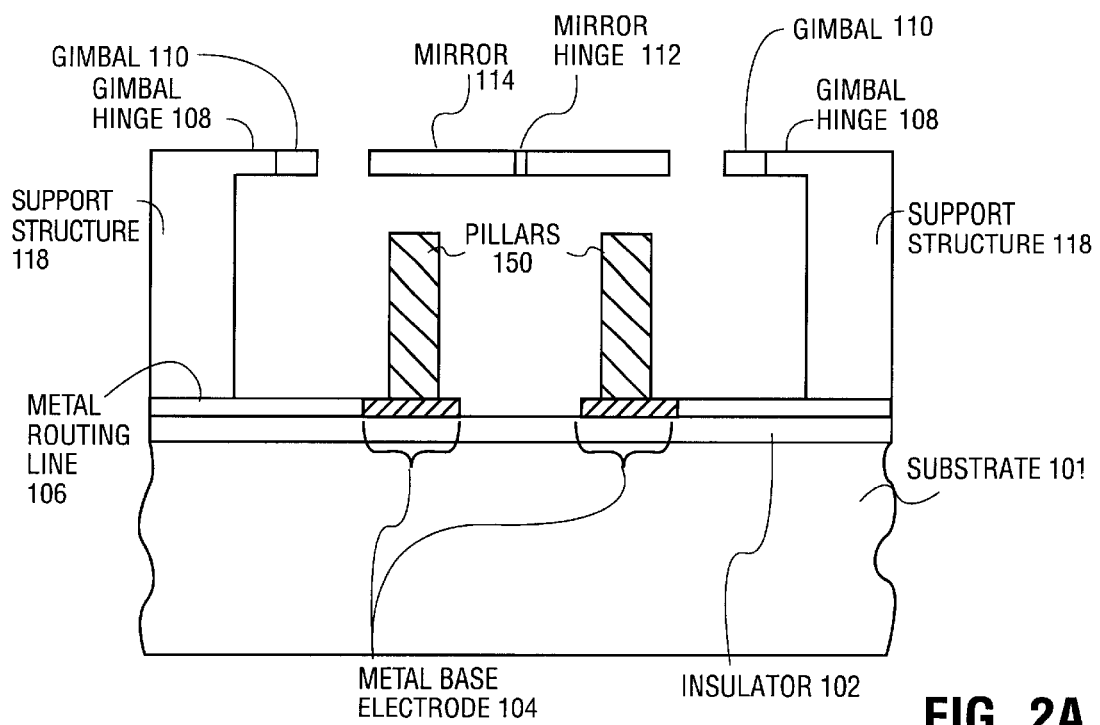
FIG. 2A illustrates a cross-sectional side view of one embodiment of the MEMS device taken along the line A–A' of FIG. 1.

FIG. 2A illustrates a cross-sectional side view of one embodiment of the MEMS device 100 taken along the line A–A' of FIG. 1. Referring to FIG. 2, the MEMS device includes a substrate 101, insulator 102, metal routing line 106, metal base electrodes 104, pillars 150, support structure 118, gimbal 110, gimbal hinge 108, mirror 114, and mirror hinge 112.

The insulator 102 is formed on substrate 101. A metal routing line 106 and metal base electrodes 104 are formed on insulator 102. The metal routing line 106 is connected electrically with metal base electrodes 104. Pillars 150 are formed on metal base electrodes 104. Pillars 150 are connected electrically with metal routing line 106 via metal base electrodes 104. The metal base electrodes 104 and pillars 150 can be formed such that pillars 150 are positioned below and near the edges of mirror 114. Alternatively, metal base electrodes 104 and pillars 150 can be positioned below and near gimbal 110 so as not to obstruct the angular range of motion of mirror 114. The location and shape of pillars 150 can be adjusted to shape an electric field in providing optimum tilt or angular range of motion for mirror 114.

Substrate 101 also provides support for support structure 118, which is formed on metal routing line 106 and adjacent to pillars 150. Support structure 118 provides support for gimbal hinge 108, gimbal 110, mirror 114, and mirror hinge 112. Gimbal hinge 108 is formed on support structure 118 and provides support for gimbal 110. Gimbal 110 supports mirror 114. Mirror 114 can pivot and rotate about mirror hinge 112. Mirror 114 can also rotate by gimbal 110 pivoting about gimbal hinge 108. Gimbal 110 is connected with mirror 114 by mirror hinge 112.

Mirror 114 can move about mirror hinge 114 and gimbal hinge 108 to have an angular range of motion caused by electrostatic actuation from metal base electrodes 104 and pillars 150. For example, electrostatic actuation can be caused by a voltage being applied to pillars 150 through a selected metal routing line 106 and metal base electrodes 104. A voltage applied to pillars 150 creates an electric field between, for example, pillars 150 and mirror 114. The electric field can be created, e.g., near the edges of mirror 114. The electric field causes mirror 114 to have an angular range of motion about mirror hinge 114 or gimbal hinge 108. Thus, the edges of mirror 114 can move or "tilt" towards one of the pillars 150 creating the electric field.

Alternatively, pillars 150 can be non-conductive. That is, pillars 150 can operate as to affect the shape of an electric field being produced from metal base electrodes 104. For example, because pillars 150 can be formed on metal base electrodes 104 or adjacent to metal base electrodes 104 thus an electric field being created for metal based electrodes 104 can be affected by the three dimensional geometry of pillars 150. Such an effect on the electric field from metal base electrodes 104 can affect the tilt and angular range of motion of mirror 114.

Figure 2B:
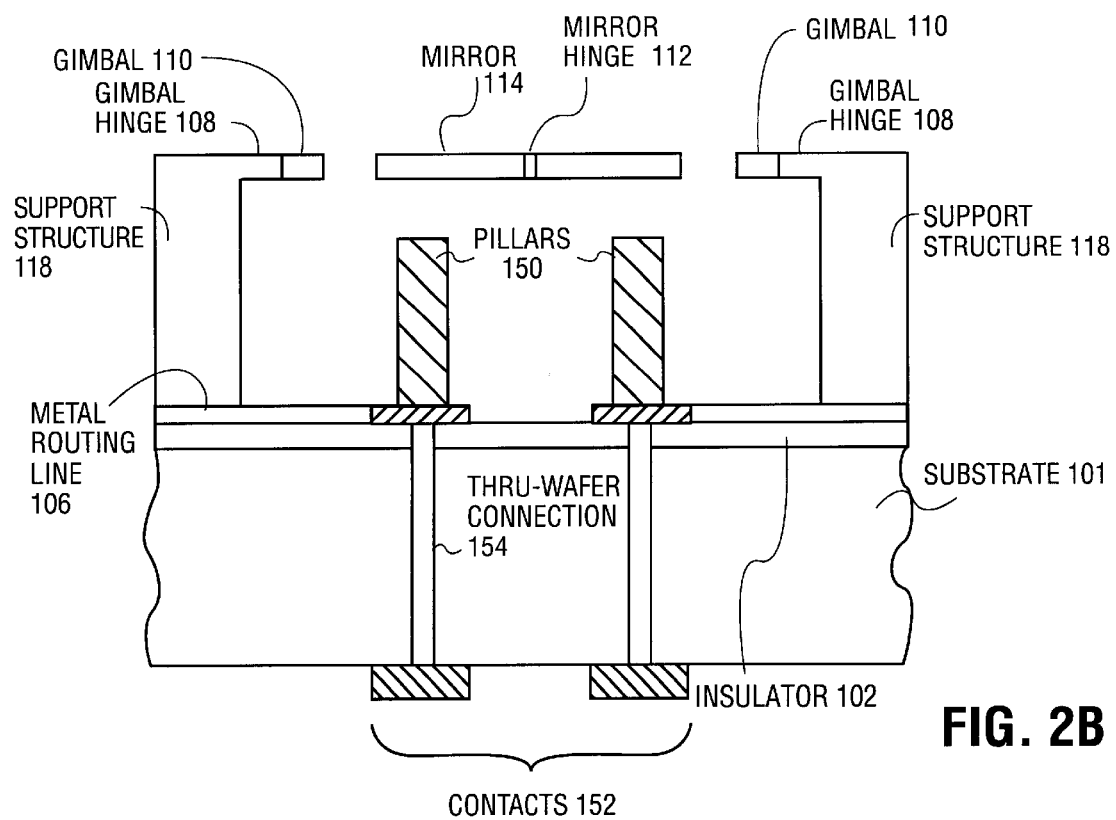
FIG. 2B illustrates a cross-sectional side view of another embodiment of the MEMS device taken along the line A–A' of FIG. 1.

FIG. 2B illustrates a cross-sectional side view of another embodiment of the MEMS device 100 taken along the line A–A' of FIG. 1. Referring to FIG. 2B, the MEMS device is the same as the MEMS device of FIG. 2A except that each of the pillars 150 is connected to contacts 152 via a thru-wafer connection 154. Thus, pillars 150 can be coupled electrically with contacts 152. By using thru-wafer connection 154, the amount of contact s that need to be formed on one side of a substrate can be reduced thereby allowing more space to form other structures.

In the examples of FIGS. 2A and 2B, the three-dimensional geometry of pillars 150 can be utilized to affect the electric field between pillars 150 and mirror 114. For example, the height of pillars 150 can be increased to decrease the gap between pillars 150 and mirror 114 so that less force is necessary to move mirror 114 and thus less voltage is required for actuation. Hence, pillars 150 operate as extended electrodes. Furthermore, the position and shape of pillars 150 can be changed to provide optimum tilt or angular range of motion for mirror 114. In addition, pillars 150 can be used as barriers (e.g., pillars 150 can be or operate as a ground plane or a protective shielding) to block interference or cross talk as will be explained in FIGS. 3A through 3G.

Figure 3A:
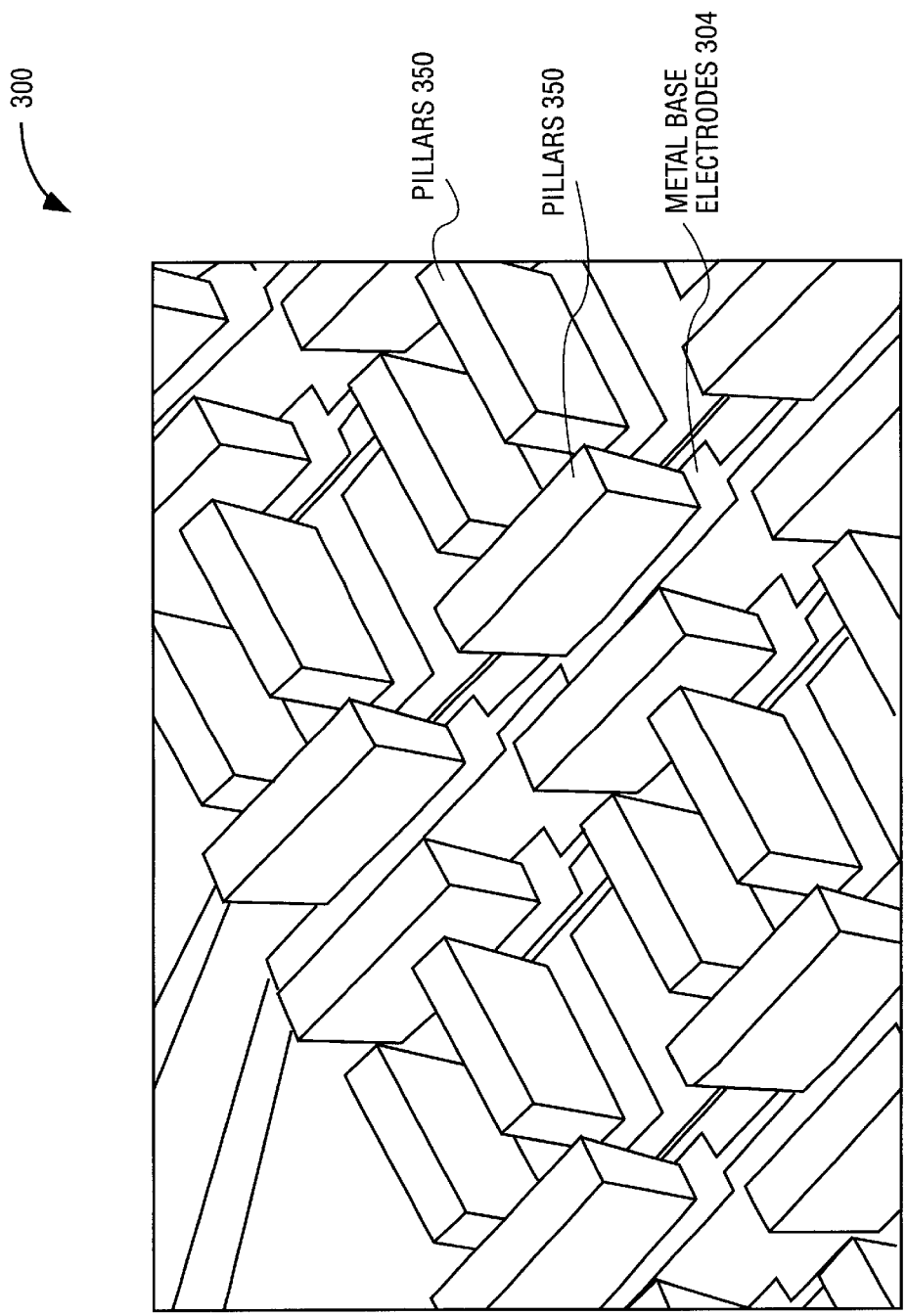
FIG. 3A illustrates a three-dimensional top view of a MEMS device having extending pillars according to one embodiment.

FIG. 3A illustrates a three-dimensional top view of a MEMS device 300 having extending pillars according to one embodiment. Referring to FIG. 3A, MEMS device 300 includes a plurality of pillars 350 formed on metal base electrodes 304, which are formed on a substrate.

The pillars 350 formed on metal base electrodes 304 can act as an extended electrode to create an electric field from a voltage being applied to metal base electrodes 304. For example, pillars 350 can be a conductive material in which a voltage applied to metal base electrodes 304 can extend through pillars 350. Thus, pillars 350 can act as extended electrode.

Alternatively, pillars 350 formed adjacent to metal base electrodes 104 can act as a protective barrier to block out interference (i.e., cross-talk) or electric fields created by neighboring metal base electrodes 304 or other pillar electrodes. For example, pillars 350 can be or operate as ground planes or protective shielding to protect against the interference or cross talk.

The MEMS device 300 represented in FIG. 3A can be a separate device referred to as a "pillar wafer" device. The MEMS device 300 can be connected to a separate MEMS mirror device having a gimbaled mirror component. For example, a gimbaled mirror device can be attached to the MEMS device 300 such as that shown in FIGS. 2A–2B and 3B.

Figure 3B:
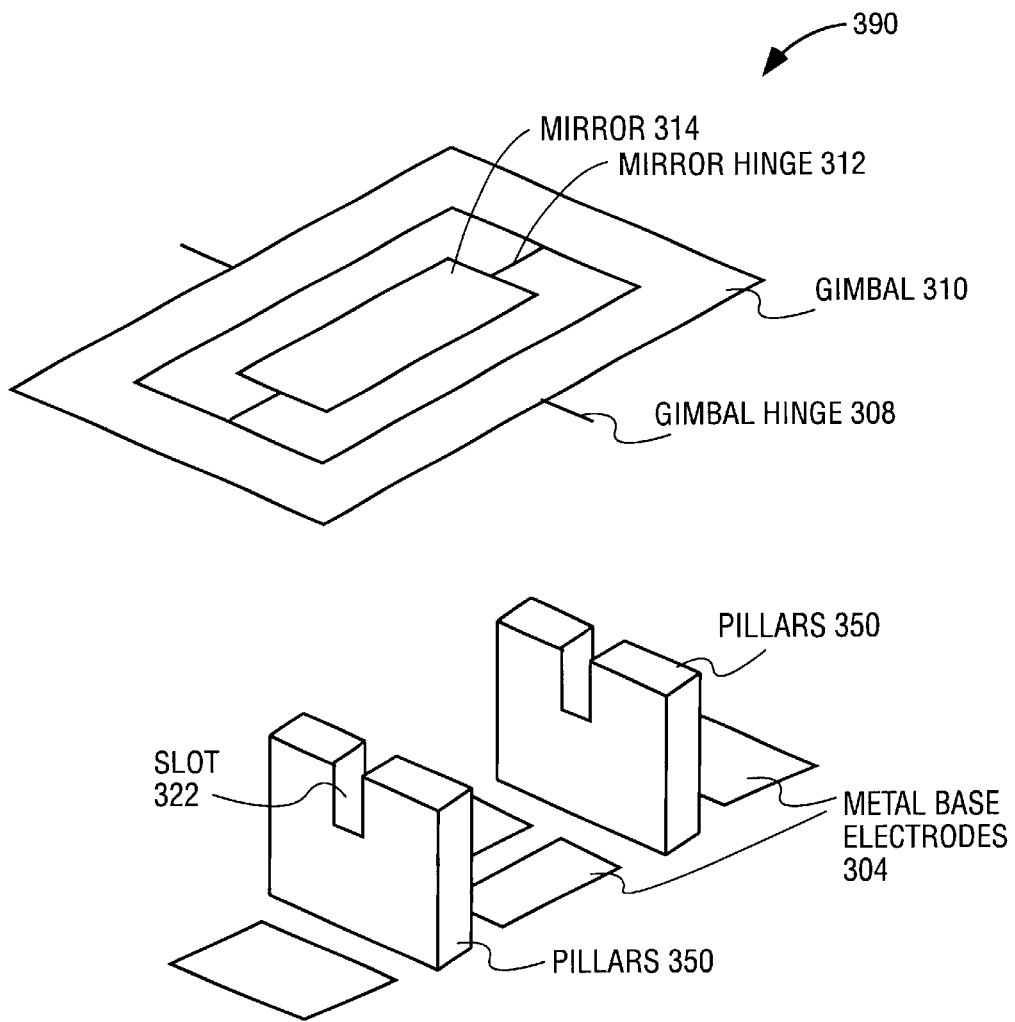
FIG. 3B illustrates a three-dimensional view of a MEMS mirror device having pillars with slots formed therein according to one embodiment.

FIG. 3B illustrates a three-dimensional view of a MEMS mirror device 390 having pillars with slots formed therein according to one embodiment. Referring to FIG. 3B, the MEMS mirror device 390 includes pillars 350 with a slot 322 formed therein. The pillars 350 are formed in between metal base electrodes 304 to act as barriers in between metal base electrodes 304. Although two pillars are shown in FIG. 3B for mirror device 390, four pillars can be used in which a pair of pillars can be formed perpendicular to the pillars 350 above and below the electrodes in between pillars 350. Alternatively, pillars 350 can also be formed on metal base electrodes 304 to act as extended electrodes.

A mirror device having a mirror 314 can be connected to a gimbal 310 by a mirror hinge 312. The gimbal 310 is connected to a support structure (not shown), which is connected with a substrate supporting pillars 350 and metal base electrodes 304, by a gimbal hinge 308. The mirror 314 is to be suspended above pillars 350 and metal base electrodes 304. Pillars 350 have a slot 322 so that if mirror 314 tilts towards the pillars 350 mirror hinge 312 can avoid making contact with pillars 350 because of slot 322. Thus, by having a slot 322 in pillars 350, mirror 314 can have a larger tilt and angular range of motion.

Figure 3C:
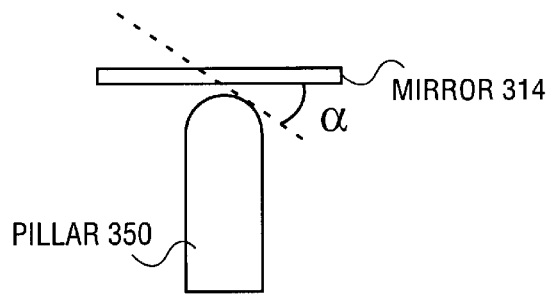
FIGS. 3C through 3G illustrate side views of exemplary shaped pillars for a MEMS mirror device.
Figure 3D:
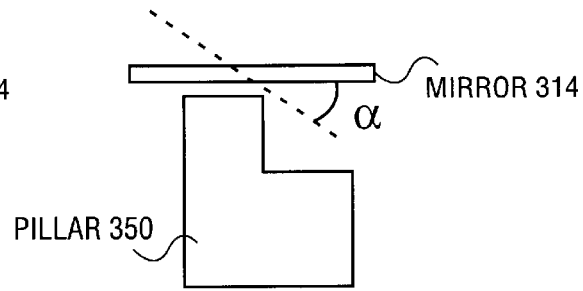

FIGS. 3C through 3G illustrate side views of exemplary shaped pillars for a MEMS mirror device. Referring to FIG. 3C, a single pillar 350 is shown to provide electrostatic actuation for mirror 314. Pillar 350 is shaped having a curved end such that mirror 314 can tilt or have an angular range of motion defined by the angle $\alpha$. Referring to FIG. 3D, a single pillar 350 is shown to provide electrostatic actuation for mirror 314. Pillar 350 has an "L" shape such that mirror 314 can tilt or have an angular range of motion defined by the angle $\alpha$.

Figure 3E:
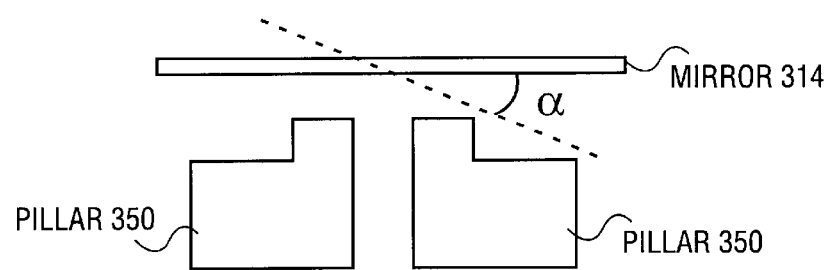
Figure 3F:
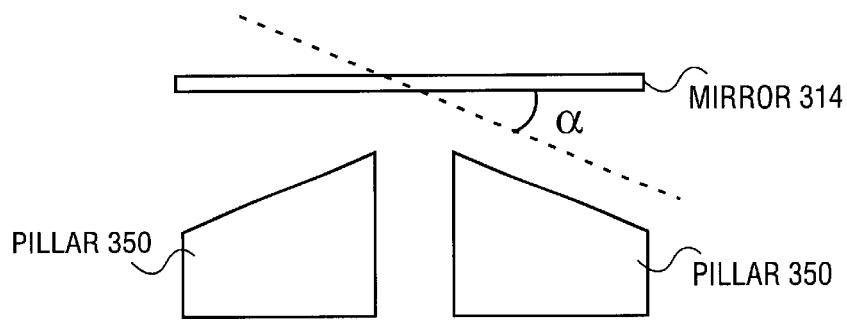

Referring to FIG. 3E, two pillars 350A and 350B are shown to provide electrostatic actuation for mirror 314. Pillar 350A has a "L" shape and pillar 350B has a mirror image shape of pillar 350A. Pillars 350A and 350B allow mirror 314 to tilt or have an angular range of motion defined by the angle $\alpha$. Referring to FIG. 3F, two pillars 350A and 350B are shown to provide electrostatic actuation for mirror 314. Pillars 350A and 350B have slanting or sloped ends such that mirror 314 can tilt or have an angular range of motion defined by the angle α.

Referring to FIG. 3E, two pillars 350A and 350B are shown to provide electrostatic actuation for mirror 314. Pillar 350A has a "L" shape and pillar 350B has a mirror image shape of pillar 350A. Pillars 350A and 350B allow mirror 314 to tilt or have an angular range of motion defined by the angle α.

Figure 3G:
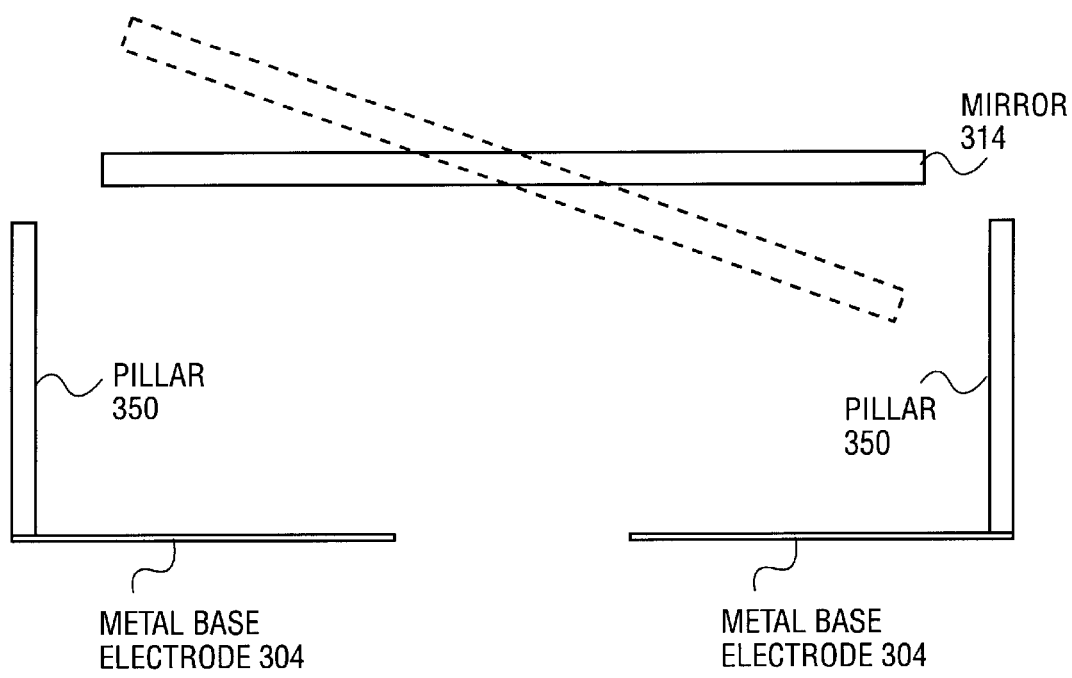

Referring to FIG. 3G, a mirror 314 is shown in which a pillar 350 is formed adjacent to each side of mirror 314. Each pillar 350 is formed on a metal base electrode 304. Each pillar 350 can provide electrostatic actuation for mirror 314. Each pillar 350 is positioned to provide a strong electric field to mirror 314 and not to obstruct the movement of mirror 314. Each pillar 350 can provide a strong electric field for mirror 314 because of its small distance to the edge of mirror 314 thus allowing for a low operating voltage for actuation.

The exemplary pillar embodiments shown in FIGS. 3A through 3G are interchangeable and can vary in numbers or shapes to increase or decrease the tilt or angular range of motion for mirror 314. Furthermore, the exemplary pillar embodiments can be designed to affect an electric field to provide optimum electrostatic actuation.

Figure 4A:
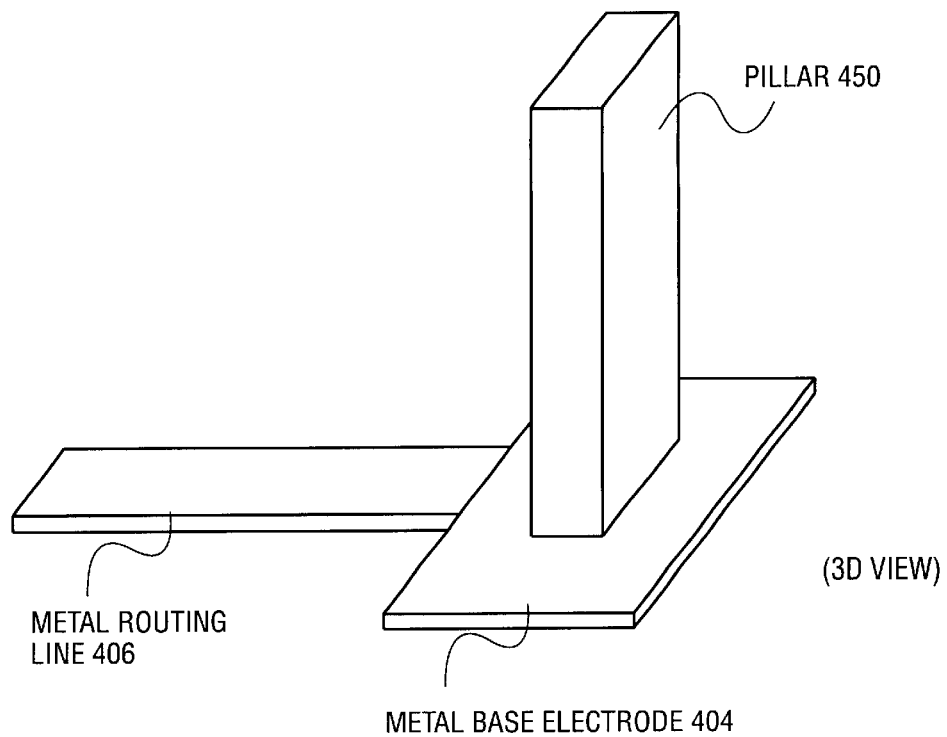
FIG. 4A illustrates a three-dimensional side view of a MEMS device having an extending pillar.

FIG. 4A illustrates a three-dimensional side view of a MEMS device having an extending pillar, which may operate as an extended electrode or a protective barrier. For purposes of illustration, the MEMS device shown in FIG. 4A is not drawn to scale in which metal routing line 406 can have a very small width.

Figure 4B:
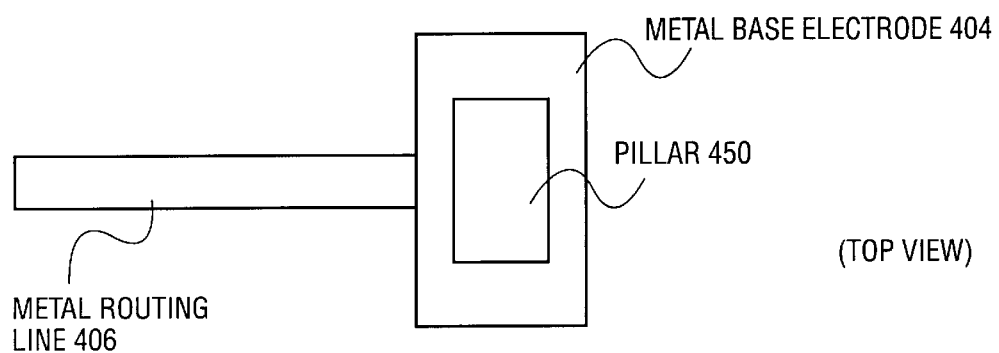
FIG. 4B illustrates a top view of the MEMS device having the extending pillar of FIG. 4A.

Referring to FIG. 4A, a pillar 450 is formed on a metal base electrode 404. A metal routing line 406 is formed adjacent and in contact with metal base electrode 404. Alternatively, metal routing line 406 can be continuous and act as the metal base electrode or vice versa. FIG. 4B illustrates a top view of the MEMS device having the extending pillar of FIG. 4A. For purposes of illustration, the MEMS device shown in FIG. 4B is not drawn to scale in which metal routing line 406 can have a very small width.

Figure 5A:
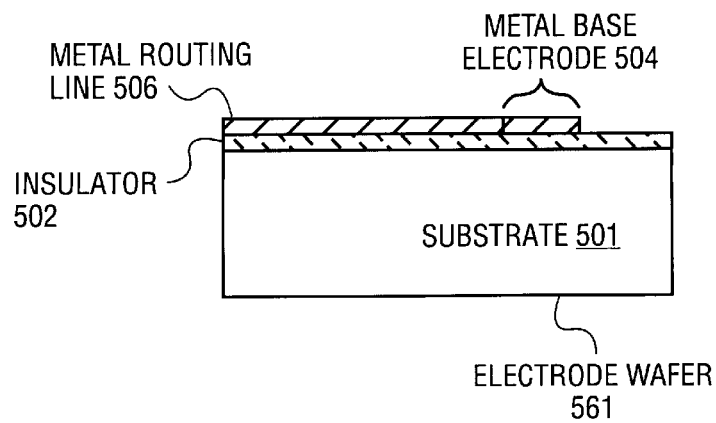
FIGS. 5A through 5C are cross-sectional side views illustrating a process of fabricating a MEMS device according to a first embodiment.
Figure 5B:
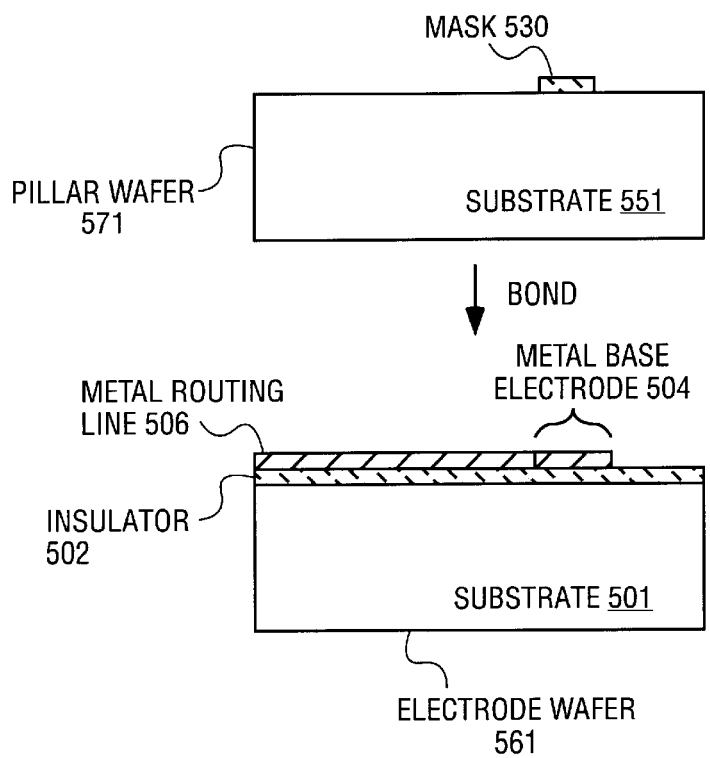
Figure 5C:
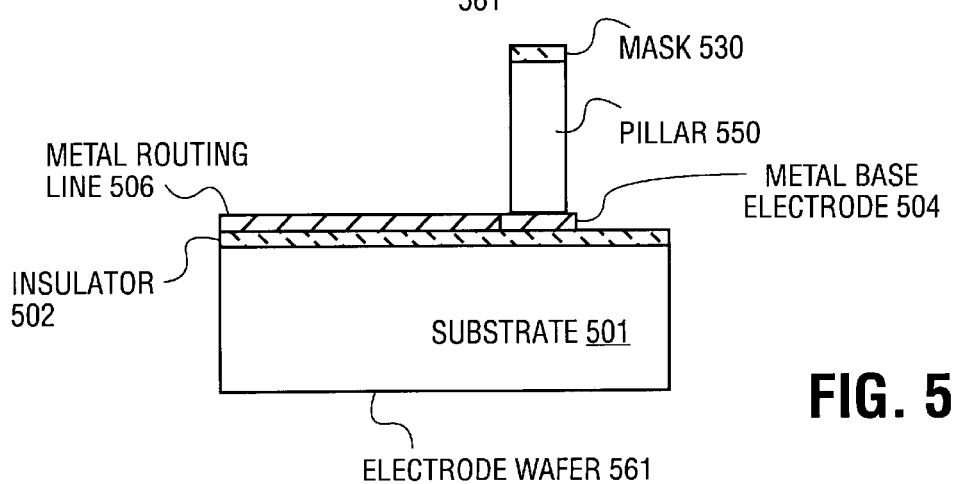

FIGS. 5A through 5C are cross-sectional side views illustrating a process of fabricating a MEMS device according to a first embodiment. The following process is depicted to fabricate a MEMS device with a single pillar, however, the following process can be implemented to fabricate a plurality of pillars, which can act as electrodes or as a protective barrier.

Referring to FIG. 5A, an electrode wafer 561 can be prefabricated having an insulator 502 formed on substrate 501 and a metal routing line 506 and metal base electrode 504 formed on insulator 502. Electrode wafer 561 can be prefabricated by forming a dielectric material on substrate 501 to form insulator 502. For example, an oxide type material such as, for example, silicon dioxide (SiO$_2$), can be formed on substrate 501 to form insulator 502. Substrate 501 can be a conductive or semiconductive material. For example, substrate 501 can be a silicon substrate.

A metal layer is then formed on insulator 502 and patterned selectively to form metal routing line 506 and metal base electrode 504. For example, a conductive material such as, for example, aluminum (Al), copper (Cu), or an alloy of Al and Cu can be formed and patterned selectively on insulator 502 to form metal routing line 506 and metal base electrode 504. Alternatively, metal routing line 506 and metal base electrode 504 can be formed separately and made of different materials.

Referring to FIG. 5B, a pillar wafer 571 can be prefabricated having a mask 530 formed on a substrate 551. The pillar wafer can be prefabricated by forming an oxide type material such as silicon dioxide (SiO$_2$) on substrate 551 and patterned selectively to form mask 530. Alternatively, a polymer or other mask type material can be formed on substrate 551 and patterned selectively to form mask 530. The mask 530 is patterned to form pillars from substrate 551. Substrate 551 can be a conductive or semiconductive material. For example, substrate 551 can be a silicon substrate.

The pillar wafer 571 is then attached with electrode wafer 561. For example, pillar wafer 571 can be bonded to electrode wafer 561. The pillar wafer 571 is bonded with electrode wafer 561 such that mask 530 is aligned with metal base electrode 504 in forming pillars on metal base electrode 504. As illustrated in FIG. 5B, the side of substrate 551 opposite of the mask 530 is bonded to the side of substrate 501 with metal routing line 506 and metal base electrode 504.

Referring to FIG. 5C, after pillar wafer 571 is attached with electrode wafer 561, portions of substrate 551 of pillar wafer 571 are removed selectively using mask 530 to form pillar 550. For example, a wet etch or a dry etch process may be used to form pillar 550 using mask 530. Alternatively, a laser ablation process or a deep reactive ion etching (RIE) process may be used to form pillar 550 using mask 530. After pillar 530 is formed, mask 530 can be removed. Alternatively, the process for removing mask 530 can be omitted.

Furthermore, the shape of pillar 550 is dictated by the process of removing selectively portions of substrate 551. For example, a profile control etching process can be used to shape pillar 550. The profile control etching process may be implemented with a time controlled deep silicon etching process may be used to control the profile of pillar 550. Alternatively, a deep reactive ion etching (RIE) process may be used in varying time intervals to shape pillar 550 from substrate 551.

To form, for example, a pillar 550 having a slanted shaped end, using the time controlled etching processes, each successive etching interval is greater in duration than a preceding interval to provide a slanted pillar. After a desired slant is achieved, a straight etching process can be used. The profile control etching process may also be implemented by increasing selectively etching parameters such as direct current (DC) bias, RIE power, and gas flow rates. Alternatively, profile control may be achieved by increasing the passivation parameters such as deposition time and passivation gas flow. Furthermore, the micro-loading condition of a silicon etch may be used to induce a desired shape. To form, for example, a pillar having a curved shaped end, a directional etching process using a gray-scale mask can be used to provide a curved shaped end. Furthermore, to form a "L" shape pillar, a wet etch or dry etch process can be implemented in steps to form the "L" shape.

The thusly-formed MEMS device uses a pillar wafer and an electrode wafer. By using a pillar wafer and an electrode wafer, a simple process of fabricating a MEMS device having pillars as electrodes is provided. In the above process, planar metal base electrodes, which can have a certain lateral size and shape (e.g., rectangular, circular, arc, etc.), are combined with three dimensional pillars in which the height, width, and depth can be utilized to form extended electrodes or protective barriers. The placement of these two components relative to each other provide a great deal of design freedom in fabricating MEMS devices.

Furthermore, forming and shaping a pillar into a desired shape can be achieved such as those shown in FIGS. 3A–3G and 4A–4B. The thusly-formed MEMS device can also be used in subsequent processes to be attached to a gimbaled mirror device or the gimbaled mirror device can be constructed on the thusly-formed MEMS device to form a MEMS mirror device such as that shown in FIGS. 2A–2B and 3A.

Figure 6A:
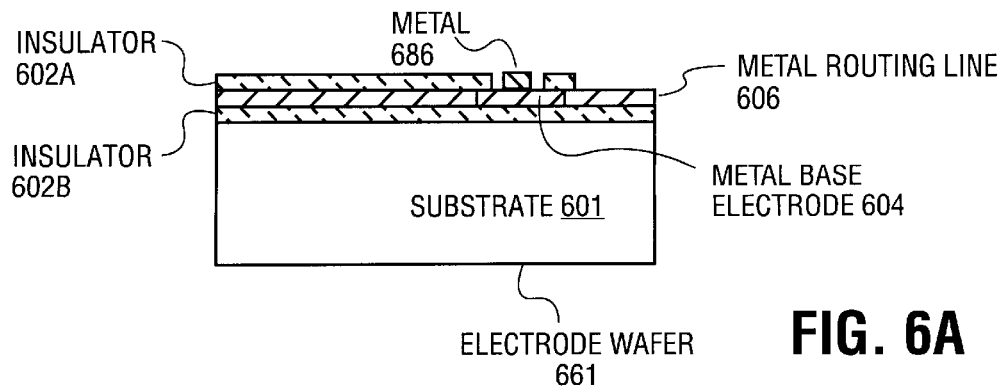
FIGS. 6A through 6C are cross-sectional side views illustrating a process of fabricating a MEMS device according to a second embodiment.
Figure 6B:
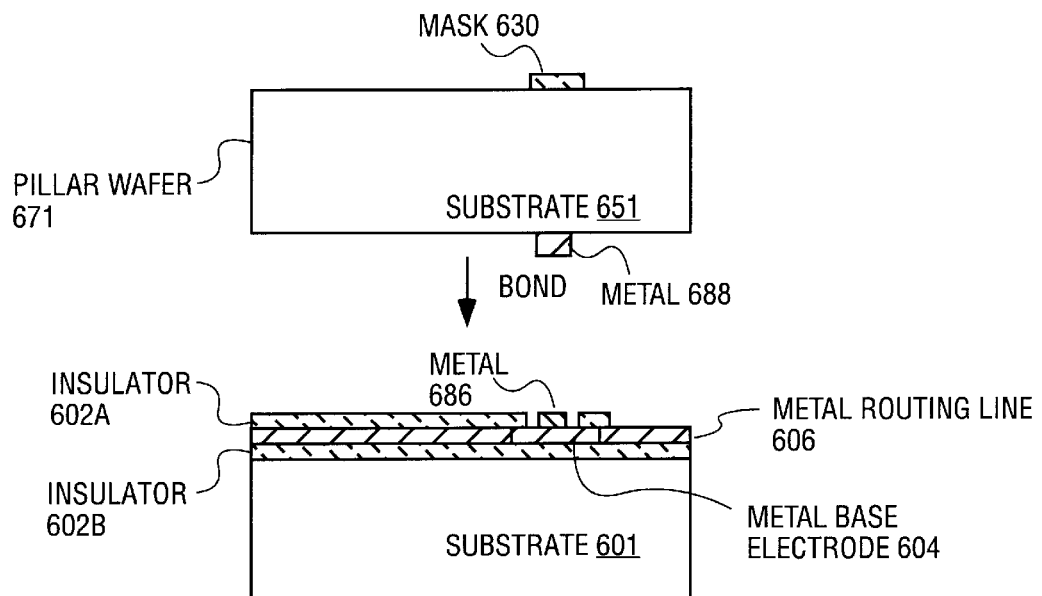
Figure 6C:
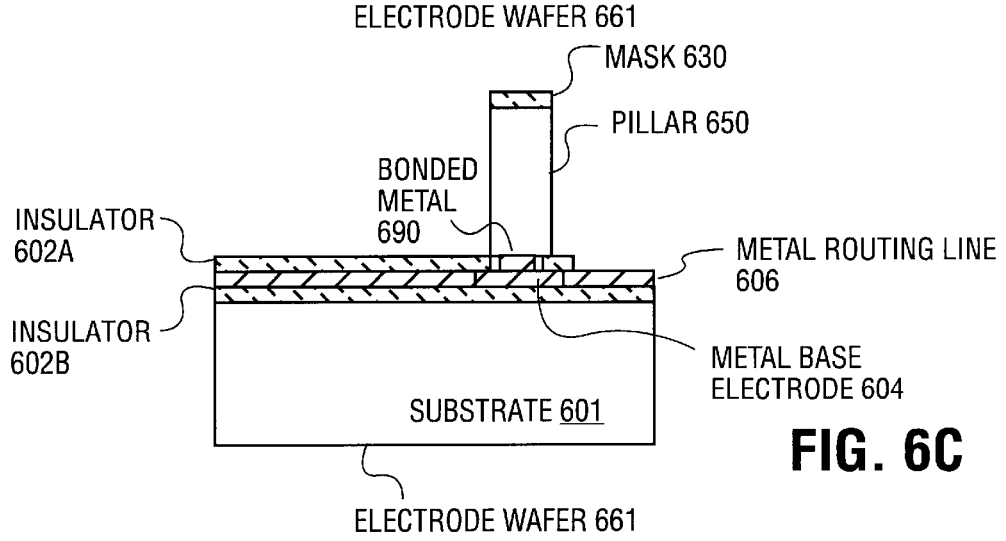

FIGS. 6A through 6C are cross-sectional side views illustrating a process of fabricating a MEMS device according to a second embodiment. The following process is depicted to fabricate a MEMS device with a single pillar, however, the following process can be implemented to fabricate a plurality of pillars, which can act as electrodes or as a protective barrier.

Referring to FIG. 6A, an electrode wafer 661 can be prefabricated having an insulator 602B formed on substrate 601, a metal routing line 606 and metal base electrode 604 formed on insulator 602B, an insulator 602A formed on metal routing line 606 and portions of metal base electrode 604, and a metal "contact" 686 formed on metal base electrode 604.

Electrode wafer 661 can be prefabricated by forming a dielectric material on substrate 601 to form insulator 602B. For example, an oxide type material such as, for example, silicon dioxide ($SiO_2$), can be formed on substrate 601 to form insulator 602B. Substrate 601 can be a conductive or semiconductive material. For example, substrate 601 can be a silicon substrate.

A metal layer is then formed on insulator 602B and patterned selectively to form metal routing line 606 and metal base electrode 604. For example, a conductive material such as, for example, aluminum (Al), copper (Cu), gold (Au), or an alloy of Al, Cu, and Au can be formed and patterned selectively on insulator 602B to form metal routing line 606 and metal base electrode 604. Alternatively, metal routing line 606 and metal base electrode 604 can be formed separately and made of different materials.

Subsequently, an oxide type material such as silicon dioxide ($SiO_2$) is formed on metal routing line 606 and metal base electrode 604. The oxide type material is then etched selectively to form a "via," which exposes the metal base electrode 604. A metal layer is then formed selectively on the exposed areas of metal base electrode 604 to form a metal "contact" 686. Metal 686 can be used in bonding electrode wafer 661 to a pillar wafer 671. The process of forming metal 686, however, may be optional and can be omitted.

Referring to FIG. 6B, a pillar wafer 671 can be prefabricated having a mask 630 formed on a substrate 651 and a metal "contact" 688 formed on substrate 651 on an opposite side of mask 630.

The pillar wafer 671 can be prefabricated by forming an oxide type material such as silicon dioxide ($SiO_2$) on substrate 651 and patterned selectively to form mask 630. Alternatively, a polymer or other mask type material can be formed on substrate 651 and patterned selectively to form mask 630. The mask 630 is patterned to form pillars from substrate 651. Substrate 651 can be a conductive or semiconductive material. For example, substrate 651 can be a silicon substrate. A metal layer is then formed selectively on substrate 651 on the opposite side of mask 630 to form a metal "contact" 688. Metal 688 is to be in bonding pillar wafer 671 to electrode wafer 661. Metal 688 is positioned to be aligned with mask 630.

The pillar wafer 671 is then attached with electrode wafer 661. For example, pillar wafer 671 can be bonded to electrode wafer 661 such that metal 686 is bonded to metal 688, or, alternatively, metal 688 is bonded with metal base electrode 604. The metal routing line 606 and metal base electrode 604 are protected from pillar wafer 671 in subsequent processes by insulator 602A. For example, metal routing line 606 and metal base electrode 604 will be protected from subsequent etching of the pillar wafer 671.

Referring to FIG. 6C, after pillar wafer 671 is attached with electrode wafer 661, portions of the first side of substrate 651 of pillar wafer 671 are removed selectively using mask 630 to form pillar 650. Pillar 650 can be formed using the same processes as described in FIG. 5C. For example, pillar 650 can be formed to have a rectangular shape, slanted end shape, curved end shape, "L" shape, or any other shape to provide an optimum electric field.

The thusly-formed MEMS device also uses a pillar wafer and an electrode wafer having a metal routing line and metal base electrode insulated. Thus, the metal routing line and metal base electrode are not exposed during etching of the pillar wafer to form the pillars, which allows other metals (e.g., gold) to be used for the metal routing line and metal base electrode. The pillar wafer and electrode wafer are bonded by metal as in contrast to silicon on metal.

The thusly-formed MEMS device can also be used in subsequent processes to be attached to a gimbaled mirror device or the gimbaled mirror device can be constructed on the thusly-formed MEMS device to form a MEMS mirror device such as that shown in FIGS. 2A–2B and 3A.

FIGS. 7A through 7D are cross-sectional side views illustrating a process of fabricating a MEMS device according to a third embodiment.

Figure 7A:
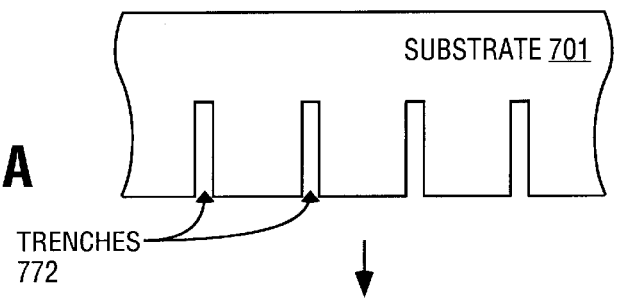
FIGS. 7A through 7D are cross-sectional side views illustrating a process of fabricating a MEMS device according to a third embodiment.

Referring to FIG. 7A, a plurality of trenches 772 are formed in a first side (e.g., bottom side) of substrate 701. For example, a mask (not shown) can be selectively patterned to define exposed areas of the bottom side of substrate 701. The exposed areas of the bottom side of substrate 701 can be etched using a wet etch or a dry etch process to form trenches 772. Alternatively, the exposed areas of the bottom side of substrate 701 can be etched using a laser ablation process or a deep reactive ion etching (RIE) process to form trenches 772.

Figure 7B:
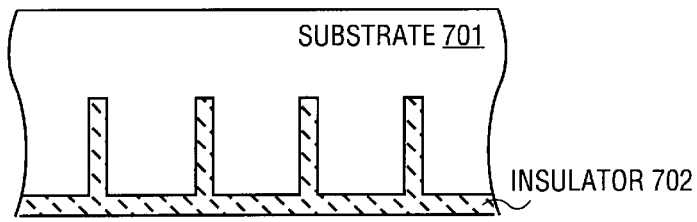
Figure 7C:
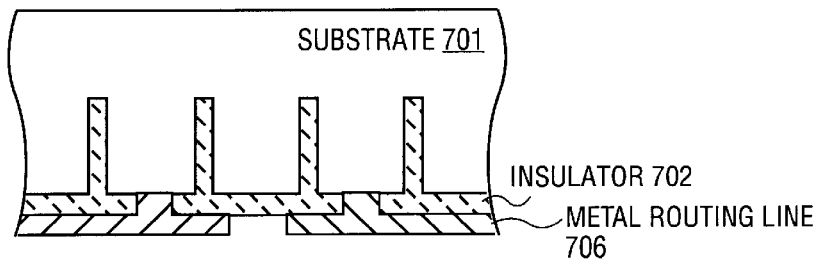

Referring to FIG. 7B, an insulator 702 is formed in trenches 772. Insulator 702 can be of the same type as insulator 502 of FIGS. 5A through 5C. Referring to FIG. 7C, insulator 702 is etched selectively to expose areas of substrate 701. A metal routing line 706 formed on insulator 702 and the exposed areas of substrate 701. Metal routing line 706 can be of the same type as metal routing line 506 of FIGS. 5A through 5C. Metal routing line 706 is etched selectively to expose areas insulator 702 so that metal routing line 706 is discontinuous between pillars.

Figure 7D:
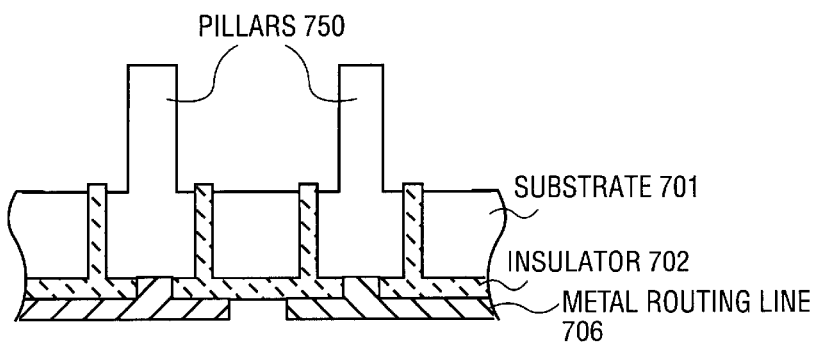

Referring to FIG. 7D, portions of the topside of substrate 701 are removed selectively to form pillars 750. For example, pillars 750 can be formed using the same processes as illustrated in FIG. 5C and FIG. 6C. That is, pillars 750 may be formed to have a rectangular shape, slanted end shape, curved end shape, "L" shape, or any other shape to provide an optimum electric field.

The thusly-formed MEMS device also uses a single wafer to form pillars, which are connected electrically with a metal routing line. Thus, the process of forming a MEMS device with pillars is simplified by using a single substrate. The thusly-formed MEMS device can also be used in subsequent processes to be attached to a gimbaled mirror device or the gimbaled mirror device can be constructed on the thusly-formed MEMS device to form a MEMS mirror device such as that shown in FIGS. 2A–2B and 3A.

Figure 8:
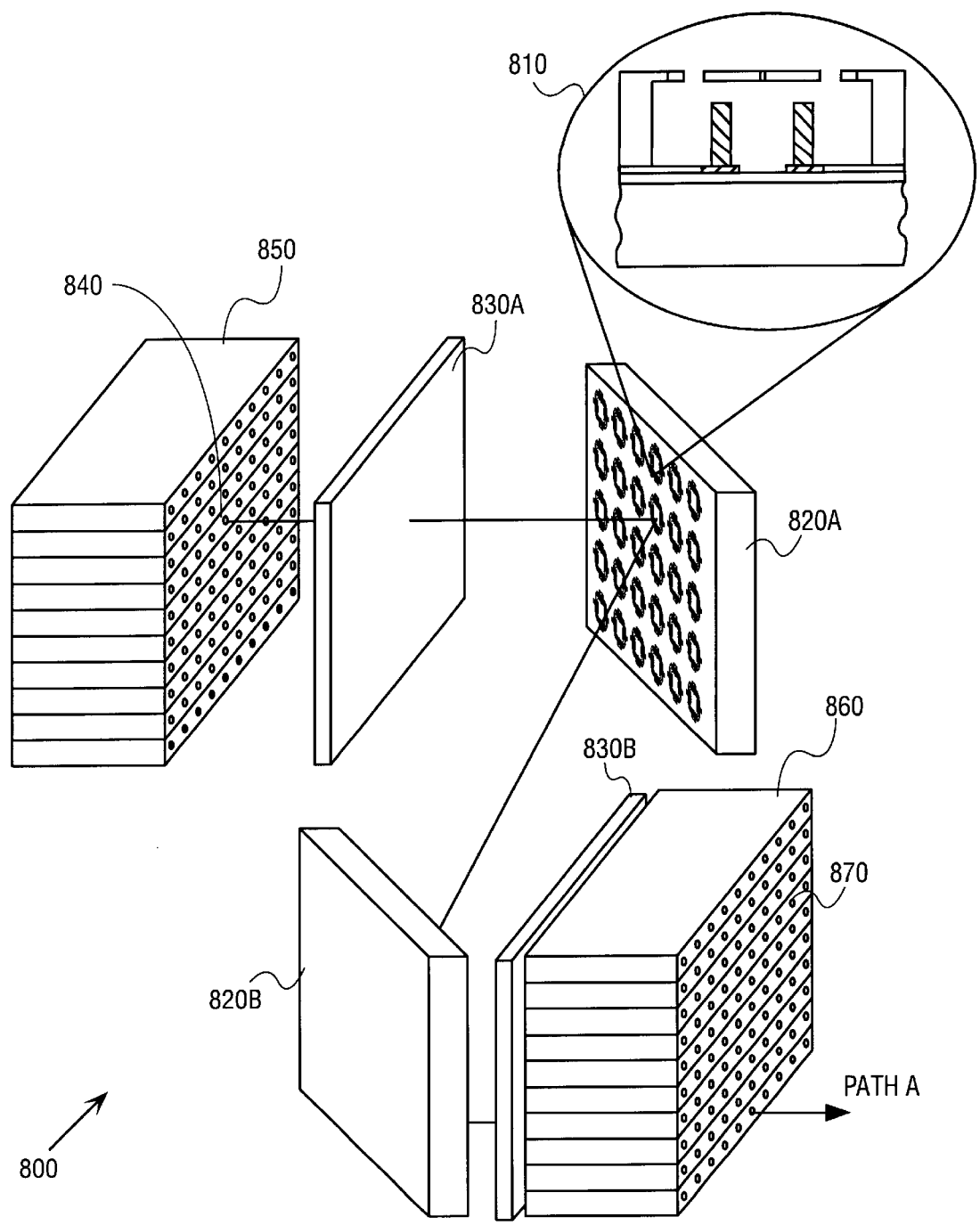
FIG. 8 illustrates an exemplary optical switching system in which the invention can be implemented.

FIG. 8 illustrates an exemplary optical switching system 800 for practicing the invention. For example, optical switching system 800 may represent a 3-dimensional optical switching system. A 3-dimensional optical switching system allows for optical coupling between input fibers and output fibers in different planes using lens arrays and mirror arrays. The lens arrays and mirror arrays provide proper angle and position of light beams traveling from input fibers to output fibers. That is, a light beam must leave and enter a fiber in a direct path.

In the following description of FIG. 8, mirror arrays are described as micro-electro-mechanical-system (MEMS) mirror arrays. MEMS mirror arrays are arrays of microscopic mirror devices formed with a substrate using integrated (IC) fabrication techniques. The mirror devices can redirect beams of light to varying positions. The MEMS mirror array can use pillars as described above to provide electrostatic actuation for the MEMS mirror arrays. Furthermore, the pillars as described above can be used as protective barriers to block interference or cross-talk from neighboring electrodes.

Referring to FIG. 8, optical switching system 800 includes input fiber "block" array 850, first lens array 830A, first MEMS mirror array 820A, second MEMS mirror array 820B, second lens array 830B, and output fiber "block" array 860.

Input fiber array 850 provides a plurality of optical fibers 840 for transmitting light to first lens array 830A. First lens array 830A includes a plurality of optical lenses, which are used to direct collimated beams of light from input fiber array 850 to individual MEMS mirror devices 810 on MEMS mirror array 820A. In the blown-up view of MEMS mirror device 810, a cross-sectional side view of a MEMS mirror device is shown such as that shown in FIG. 2A. MEMS mirror device 810 can be formed with shaped electrodes and pillars as described with regards to FIGS. 2B, 3A–3F, 4A–4B, 5A–5C, 6A–6C, and 7A–7D. First lens array 830A may be connected with input fiber array 850 or first lens array 830A may be a separate unit placed in front of input fiber array 850.

MEMS mirror array 820A includes a plurality of electrically addressable MEMS mirror devices 810. For example, MEMS mirror device 810 may be a gimbaled mirror device having a rectangular, elliptical, or circular shape. MEMS mirror device 810 may have other shapes or configurations to redirect beams of light. The plurality of MEMS mirror devices 810 for MEMS mirror array 820A can pivot a mirror component to redirect or reflect beams of light to varying MEMS mirror devices on second MEMS mirror array 820B. Second MEMS mirror array 820B also includes a plurality of MEMS mirror devices such as a MEMS mirror device 810, which are used to redirect and reflect light beams to varying lenses on second lens array 830B.

Second lens array 830B accepts collimated light beams from second MEMS mirror array 820B and focuses the light beams to individual output fibers 870 of output fiber array 860. Second lens array 830B may be connected with input fiber array 860 or second lens array 830B may be a separate unit placed in front of output fiber array 860.

Optical switching system 800 allows light beams from any input fiber 840 of input fiber array 850 to be redirected to any output fiber 870 of output fiber array 860 by changing the angle of mirrors 810 in mirror arrays 820A and 820B. For example, a light beam following the path "A" is outputted from one input fiber and is redirected using first lens array 830A, second lens array 830B, and MEMS mirror arrays 820A and 820B to a different output fiber. The lens arrays and MEMS mirror arrays may also be used in scanning systems, printing systems, display systems, and other systems that require redirecting beams of light.

Thus, shaped electrodes for micro-electro-mechanical-system (MEMS) devices to improve actuator performance and methods for fabricating the same have been described. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method of fabricating a micro-electro-mechanical-system (MEMS) device, the method comprising:

attaching a pillar wafer to an electrode wafer; and forming one or more pillars from the pillar wafer, wherein forming the shaped pillars includes forming "L" shaped pillars, slanted shaped pillars, curved shaped pillars, or pillars with slots formed therein.

2. The method of claim 1, further comprising:

forming one or more gimbaled mirror devices on the electrode wafer such that the pillars are to provide an electric field or to provide a barrier.

3. A method of fabricating a micro-electro-mechanical-system (MEMS) device, the method comprising:

forming a plurality of trenches in a first side of a substrate;

forming an insulator in the plurality of trenches and on the first side of the substrate such that the insulator defines exposed areas of the first side of the substrate;

forming a metal line on the insulator and exposed areas of the first side of the substrate; and removing selectively portions of a second side of the substrate to form pillars connected with the insulator and metal line.

4. The method of claim 3, wherein removing selectively portions of the second side of the substrate includes forming shaped pillars.

5. The method of claim 3, wherein removing selectively portions of the second side of the substrate includes forming "L" shaped pillars, slanted shaped pillars, curved shaped pillars, or pillars with slots formed therein.

6. The method of claim 3, wherein forming the metal line includes forming a discontinuous metal line.

7. The method of claim 3, further comprising:

forming one or more gimbaled mirror devices on the substrate such that the pillars are to provide an electric field or to provide a barrier.

* * * * *